United States Patent [19]

Long et al.

[11] Patent Number: 4,766,842
[45] Date of Patent: Aug. 30, 1988

[54] METHOD AND MEANS FOR WAVE SOLDERING OF LEADS OF AN INTEGRATED CIRCUIT PACKAGE

[76] Inventors: Jon Long, Livermore, Calif.; LSI Logic Corporation, 02, Milpitas, Calif.

[21] Appl. No.: 43,895

[22] Filed: Apr. 29, 1987

[51] Int. Cl.⁴ ............................ B05C 3/02; B05C 3/00
[52] U.S. Cl. ...................... 118/409; 118/410; 118/416; 118/423; 118/428
[58] Field of Search .............. 118/410, 409, 423, 428, 118/416

[56] References Cited

U.S. PATENT DOCUMENTS

| | | | |
|---|---|---|---|
| 3,053,215 | 9/1962 | Guty | 118/428 |
| 3,705,457 | 12/1972 | Tardoskegyi | 427/96 |
| 3,713,876 | 1/1973 | Lauric | 427/96 |
| 4,465,014 | 8/1984 | Bajka | 118/410 |
| 4,566,624 | 1/1986 | Comerford | 118/410 |
| 4,657,172 | 4/1987 | Lee | 228/254 |
| 4,666,077 | 5/1987 | Rahn | 118/410 |
| 4,695,481 | 9/1987 | Kawamata | 427/96 |

Primary Examiner—Shrive P. Beck
Assistant Examiner—Vi Duong Dang
Attorney, Agent, or Firm—Nathan N. Kallman; Alan H. MacPherson; Paul J. Winters

[57] ABSTRACT

Solder coating of lead of IC packages is accomplished by passing IC packages on a pallet through a solder wave. The rectangular or square IC packages are positioned so that they are tilted relative to the horizontal and rotated so that a side or adjacent sides of the package enter and exit the solder wave at an angle that is not 90° or 180°.

8 Claims, 1 Drawing Sheet

METHOD AND MEANS FOR WAVE SOLDERING OF LEADS OF AN INTEGRATED CIRCUIT PACKAGE

FIELD OF THE INVENTION

This invention relates to an improved method and means for soldering electrical leads associated with an integrated circuit package.

BACKGROUND OF THE INVENTION

Description of the Prior Art

During production of integrated circuit package assemblies, one step of the process is the solder coating of leads, conventionally made of copper. The solder coating serves to prevent undesirable oxidation of the leads that would adversely affect solderability and electrical conduction during operation of the integrated circuit device. To implement the solder coating of the leads, wave is one soldering technique used. The coating process is implemented by positioning the integrated circuit package in a holder, which is then directed into a molten solder wave. The conventional method places each IC package flat on a pallet, with one side of the rectangular or square package facing the solder wave, as the package on the pallet approaches and enters the solder wave. A problem that exists with this method is that after the integrated circuit package and its external leads are passed through the solder wave, the solder material tends to cool and form solder drops or clumps which generally occur at the ends of the leads. Since the fine pitch leads are usually spaced about 0.025 inch apart, center to center, the solder clumps that form can bridge the gaps between the leads and cause electrical shorting contacts.

SUMMARY OF THE INVENTION

An object of this invention is to provide an improved method and means for solder coating leads of an integrated circuit package.

Another object of this invention is to provide a method and means for preventing solder accumulation and electrical shorting during the solder coating of closely spaced leads of an integrated circuit package.

In accordance with this invention, the leads of an IC package are coated by passing the package and its leads through a molten solder wave. The rectangular or square integrated circuit packages are fixedly positioned on a holder or pallet so that each package enters and exits from the solder wave in a tilted position. Also, each package is set in a rotated position on the pallet so that a corner, not a side, of the package enters and exits from the solder wave. By rotating and tilting the package assembly relative to the pallet and to the solder wave, unwanted solder clumping is avoided and electrical shorting is prevented.

DESCRIPTION OF THE DRAWINGS

The invention will be described in detail with reference to the drawing in which.

Similar numerals refer to similar elements throughout the drawing.

DETAILED DESCRIPTION OF THE INVENTION

Figure 1:
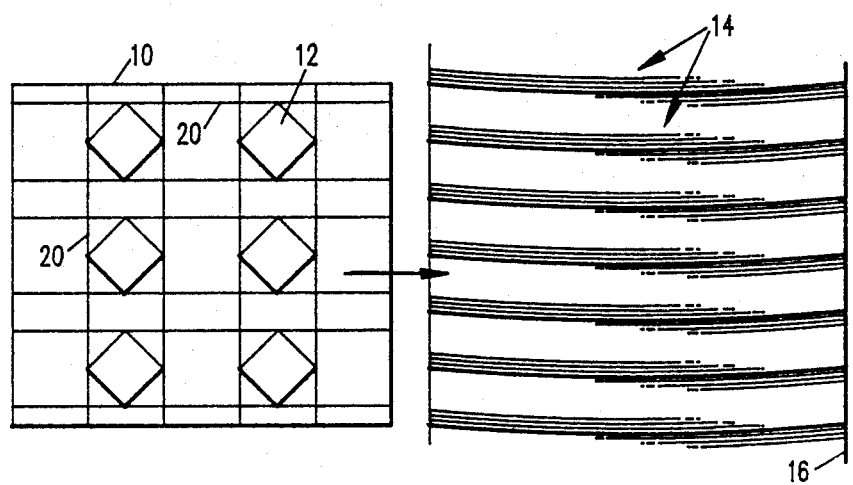
FIG. 1 is a representational top plan view of a pallet supporting a number of integrated circuit packages, adjacent to a solder wave.
Figure 2:
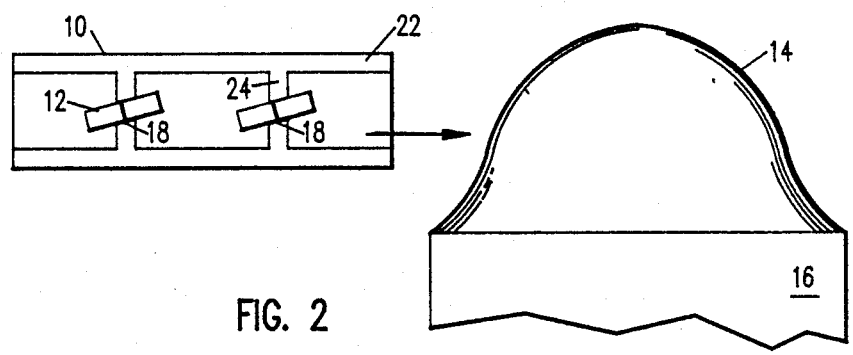
FIG. 2 is a sectional side view of the pallet and solder wave of FIG. 1.
Figure 3:
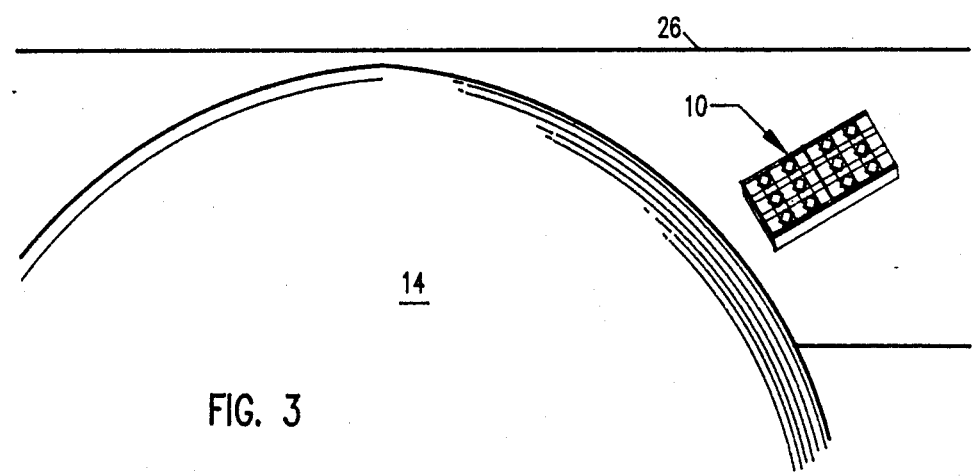
FIG. 3 is an enlarged side view illustrating the aspect of a pallet and IC package relative to a solder wave as the pallet exits from the solder wave.

With reference to the figures of the drawing, a pallet 10 supports a number of IC packages 12 seated in an array. In keeping with this invention, the rectangular or square integrated circuit (IC) packages are rotated approximately 45° so that a corner of each IC package is facing towards a solder wave 14. The solder wave is generated by a pumping mechanism, which spurts the solder in a molten state to a given height above the reservoir or container 16 of solder.

The IC packages are seated on an angular surface or ramp 18 so that the corner or nose of the IC package facing the solder wave is pointed up at an angle of about 10°-20° relative to the horizontal. The packages are maintained in position by crossed rails 20 that enclose and isolate each IC package. Furthermore, a gate or door 22 having fingers 24 is lowered to hold the packages firmly in a stationary position. The portion of each finger 24 that contacts a respective IC package is configured to have an angle of about 10°-20°, corresponding to the angle of the ramp below the IC package.

The fixed IC package assemblies are thus in a tilted and rotated position, in accordance with this invention, when moved into and through the solder wave by a conveyor 26, for example. The rectangular or square IC packages are positioned in a rotated orientation so that as they enter the solder wave with adjacent sides at an angle to the direction of entry into the solder wave. The IC packages maintain the angular orientation, as well as the tilted position, along the path of movement through the solder wave. A preferred angular rotation is about 45° relative to the path of movement of the pallet. The packages in effect surf through the solder wave so that the solder coats the external package leads without solder accumulation and clumping. As the pallet exits from the solder wave, excess solder drips down and back into the solder wave so that there is no undue loss of solder material during the coating process. By virtue of the surfing action effectuated by passing tilted and rotated IC packages through a solder wave, substantially smooth solder coating of leads is accomplished without the problems of solder clumping and resultant electrical shorting.

What is claimed is:

1. An apparatus for solder coating leads of integrated circuit packages comprising:
   a plurality of rectangular or square integrated circuit packages having leads;
   a pallet for supporting said packages for transport along a substantially linear path, said pallet including ramps having surfaces on which said packages are seated, said ramp surfaces being tilted relative to a supportive surface of said pallet;
   means for maintaining each of said packages in a fixed and tilted position.

2. An apparatus as in claim 1, wherein said ramp surfaces are tilted at an angle of about 10°-20° relative to the supporting surface of said pallet during entry and exit of said packages into and from said solder wave.

3. An apparatus as in claim 1, wherein said position maintaining means comprises a gate having fingers for making frictional contact with said packages.

4. An apparatus as in claim 3, wherein said fingers have angular portions for contacting said packages, said angular portions of said fingers being configured to correspond to the tilt angle of said ramp surfaces.

5. An apparatus as in claim 1, wherein said position maintaining means holds said packages in a rotated position relative to said linear path, so that adjacent sides are disposed angularly relative to said linear path.

6. An apparatus as in claim 5, wherein said adjacent sides define an angle of about 45° relative to said linear path.

7. An apparatus as in claim 5, including means for supplying a solder wave for solder coating said leads when said pallet and packages are transported through said solder wave in a tilted and rotated position.

8. Apparatus as in claim 7, wherein the angle of entry and the angle of exit of said packages relative to the linear path of said pallet as it passes through the solder wave are substantially the same.

* * * * *